(12) United States Patent
Thompson et al.

(10) Patent No.: US 11,817,285 B2
(45) Date of Patent: Nov. 14, 2023

(54) INGRESS-TOLERANT INPUT DEVICES COMPRISING SLIDERS

(71) Applicant: Medtronic MiniMed, Inc., Northridge, CA (US)

(72) Inventors: Chase A. Thompson, Sylmar, CA (US); Adam S. Trock, Simi Valley, CA (US)

(73) Assignee: Medtronic MiniMed, Inc., Northridge, CA (US)

(*) Notice: Subject to any disclaimer, the term of this patent is extended or adjusted under 35 U.S.C. 154(b) by 119 days.

(21) Appl. No.: 17/465,721

(22) Filed: Sep. 2, 2021

(65) Prior Publication Data
US 2023/0066790 A1 Mar. 2, 2023

(51) Int. Cl.
*H01H 9/04* (2006.01)
*G01D 5/14* (2006.01)
(Continued)

(52) U.S. Cl.
CPC .............. *H01H 9/04* (2013.01); *G01D 5/145* (2013.01); *H01H 15/10* (2013.01); *H01H 15/16* (2013.01); *H01H 2235/01* (2013.01)

(58) Field of Classification Search
CPC .... H01H 15/10; H01H 15/16; H01H 2235/01; H01H 9/04; H01H 2221/00; H01H 2221/014; H01H 2001/00; H01H 2001/54; H01H 2009/00; H01H 2009/02; H01H 2007/00; H01H 2007/03; H01H 2007/032; H01H 15/00; H01H 15/02; H01H 15/06; H01H 15/24; H01H 9/00; G01D 5/145; G01D 5/00; G01D 5/02; G01D 5/06; G01D 5/12; G01D 5/14; G01D 5/142
(Continued)

(56) References Cited

U.S. PATENT DOCUMENTS 3,873,957 A * 3/1975 Wurscher ............... H03K 17/90
335/207
4,438,305 A 3/1984 Johnson
(Continued)

FOREIGN PATENT DOCUMENTS

EP 1836945 A2 9/2007
WO 2011158877 A1 12/2011

OTHER PUBLICATIONS

Extended Search Report from counterpart European Application No. 22192652.0 dated Jan. 26, 2023, 9 pp.
(Continued)

*Primary Examiner* — Anthony R Jimenez
(74) *Attorney, Agent, or Firm* — Shumaker & Sieffert, P.A.

(57) ABSTRACT

This disclosure relates to ingress-tolerant input devices comprising sliders. Aspects of the disclosure relate to an ingress-tolerant switch assembly for operating an electronic device in an ingress-protected manner. The switch assembly is at least partially disposed on an outer surface of an enclosure of the electronic device and generally includes a spring, a magnet coupled to the spring, and a slider coupled to the magnet. A spring force of the spring is overcome by a user moving the slider relative to the enclosure such that the slider moves the magnet into proximity of the magnetic sensor to cause the magnetic sensor to generate a sensor signal for performing a function of the electronic device.

20 Claims, 2 Drawing Sheets

(51) Int. Cl.
*H01H 15/10* (2006.01)
*H01H 15/16* (2006.01)

(58) Field of Classification Search
USPC ........................................................ 200/329
See application file for complete search history.

(56) References Cited

U.S. PATENT DOCUMENTS

| | | | |
|---|---|---|---|
| 4,737,751 A | 4/1988 | Risk | |
| 4,755,173 A | 7/1988 | Konopka et al. | |
| 5,391,250 A | 2/1995 | Cheney, II et al. | |
| 5,485,408 A | 1/1996 | Blomquist | |
| 5,522,803 A | 6/1996 | Teissen-Simony | |
| 5,665,065 A | 9/1997 | Colman et al. | |
| 5,800,420 A | 9/1998 | Gross et al. | |
| 5,807,375 A | 9/1998 | Gross et al. | |
| 5,925,021 A | 7/1999 | Castellano et al. | |
| 5,954,643 A | 9/1999 | Van Antwerp et al. | |
| 6,007,377 A | 12/1999 | Cook | |
| 6,017,328 A | 1/2000 | Fischell et al. | |
| 6,186,982 B1 | 2/2001 | Gross et al. | |
| 6,246,992 B1 | 6/2001 | Brown | |
| 6,248,067 B1 | 6/2001 | Causey, III et al. | |
| 6,248,093 B1 | 6/2001 | Moberg | |
| 6,355,021 B1 | 3/2002 | Nielsen et al. | |
| 6,379,301 B1 | 4/2002 | Worthington et al. | |
| 6,544,212 B2 | 4/2003 | Galley et al. | |
| 6,558,351 B1 | 5/2003 | Steil et al. | |
| 6,591,876 B2 | 7/2003 | Safabash | |
| 6,641,533 B2 | 11/2003 | Causey, III et al. | |
| 6,736,797 B1 | 5/2004 | Larsen et al. | |
| 6,749,587 B2 | 6/2004 | Flaherty | |
| 6,766,183 B2 | 7/2004 | Walsh et al. | |
| 6,801,420 B2 | 10/2004 | Talbot et al. | |
| 6,804,544 B2 | 10/2004 | Van Antwerp et al. | |
| 7,003,336 B2 | 2/2006 | Holker et al. | |
| 7,029,444 B2 | 4/2006 | Shin et al. | |
| 7,066,909 B1 | 6/2006 | Peter et al. | |
| 7,137,964 B2 | 11/2006 | Flaherty | |
| 7,303,549 B2 | 12/2007 | Flaherty et al. | |
| 7,399,277 B2 | 7/2008 | Saidara et al. | |
| 7,442,186 B2 | 10/2008 | Blomquist | |
| 7,602,310 B2 | 10/2009 | Mann et al. | |
| 7,647,237 B2 | 1/2010 | Malave et al. | |
| 7,699,807 B2 | 4/2010 | Faust et al. | |
| 7,727,148 B2 | 6/2010 | Talbot et al. | |
| 7,785,313 B2 | 8/2010 | Mastrototaro | |
| 7,806,886 B2 | 10/2010 | Kanderian, Jr. et al. | |
| 7,819,843 B2 | 10/2010 | Mann et al. | |
| 7,828,764 B2 | 11/2010 | Moberg et al. | |
| 7,879,010 B2 | 2/2011 | Nunn et al. | |
| 7,890,295 B2 | 2/2011 | Shin et al. | |
| 7,892,206 B2 | 2/2011 | Moberg et al. | |
| 7,892,748 B2 | 2/2011 | Norrild et al. | |
| 7,901,394 B2 | 3/2011 | Ireland et al. | |
| 7,942,844 B2 | 5/2011 | Moberg et al. | |
| 7,946,985 B2 | 5/2011 | Mastrototaro et al. | |
| 7,955,305 B2 | 6/2011 | Moberg et al. | |
| 7,963,954 B2 | 6/2011 | Kavazov | |
| 7,977,112 B2 | 7/2011 | Burke et al. | |
| 7,979,259 B2 | 7/2011 | Brown | |
| 7,985,330 B2 | 7/2011 | Wang et al. | |
| 8,024,201 B2 | 9/2011 | Brown | |
| 8,100,852 B2 | 1/2012 | Moberg et al. | |
| 8,114,268 B2 | 2/2012 | Wang et al. | |
| 8,114,269 B2 | 2/2012 | Cooper et al. | |
| 8,137,314 B2 | 3/2012 | Mounce et al. | |
| 8,181,849 B2 | 5/2012 | Bazargan et al. | |
| 8,182,462 B2 | 5/2012 | Istoc et al. | |
| 8,192,395 B2 | 6/2012 | Stes et al. | |
| 8,195,265 B2 | 6/2012 | Goode, Jr. et al. | |
| 8,202,250 B2 | 6/2012 | Stutz, Jr. | |
| 8,207,859 B2 | 6/2012 | Enegren et al. | |
| 8,226,615 B2 | 7/2012 | Bikovsky | |
| 8,257,259 B2 | 9/2012 | Brauker et al. | |
| 8,267,921 B2 | 9/2012 | Yodfat et al. | |
| 8,275,437 B2 | 9/2012 | Brauker et al. | |
| 8,277,415 B2 | 10/2012 | Mounce et al. | |
| 8,292,849 B2 | 10/2012 | Bobroff et al. | |
| 8,298,172 B2 | 10/2012 | Nielsen et al. | |
| 8,303,572 B2 | 11/2012 | Adair et al. | |
| 8,305,580 B2 | 11/2012 | Aasmul | |
| 8,308,679 B2 | 11/2012 | Hanson et al. | |
| 8,313,433 B2 | 11/2012 | Cohen et al. | |
| 8,318,443 B2 | 11/2012 | Norrild et al. | |
| 8,323,250 B2 | 12/2012 | Chong et al. | |
| 8,343,092 B2 | 1/2013 | Rush et al. | |
| 8,352,011 B2 | 1/2013 | Van Antwerp et al. | |
| 8,353,829 B2 | 1/2013 | Say et al. | |
| 9,672,328 B2 | 6/2017 | Saint et al. | |
| 10,835,727 B2 | 11/2020 | Montalvo et al. | |
| 2007/0123819 A1 | 5/2007 | Mernoe et al. | |
| 2010/0160861 A1 | 6/2010 | Causey, III et al. | |
| 2011/0160654 A1 | 6/2011 | Hanson et al. | |
| 2016/0015887 A1 | 1/2016 | Pananen et al. | |
| 2020/0327973 A1 | 10/2020 | Pryor et al. | |

OTHER PUBLICATIONS

Notice of Allowance from U.S. Appl. No. 17/465,708 dated Oct. 11, 2022, 8 pp.
Response to Office Action dated Jun. 27, 2022 from U.S. Appl. No. 17/465,708, filed Sep. 26, 2022, 10 pp.
Office Action from U.S. Appl. No. 17/465,708 dated Jun. 27, 2022, 12 pp.

* cited by examiner

INGRESS-TOLERANT INPUT DEVICES COMPRISING SLIDERS

TECHNICAL FIELD

This disclosure relates generally to input devices, and more particularly, to ingress-tolerant input devices comprising sliders.

BACKGROUND

Many electronic devices include a watertight housing or enclosure to protect the internal mechanisms and electronics from the damaging effects of water. The Ingress Protection Code (IP Code) is published by the International Electrotechnical Commission (IEC) to classify and rate the degree of protection provided by mechanical casings and electrical enclosures against intrusion, dust, accidental contact, and water. For example, the "8" in "IPX8" indicates the level of protection that mechanical casings and electrical enclosures provide against the ingress of water. More specifically, devices having the "IPX8" rating are capable of being immersed in more than 1 meter of water without harmful effects. Water ingress may be of particular concern with certain types of medical devices, such as portable medical devices that are subject to a variety of environmental conditions.

SUMMARY

This disclosure relates to ingress-tolerant input devices comprising sliders. Aspects of the disclosure relate to an ingress-tolerant switch assembly for operating an electronic device in an ingress-protected manner. The switch assembly is at least partially disposed on an outer surface of an enclosure of the electronic device and generally includes a spring, a magnet coupled to the spring, and a slider coupled to the magnet. A spring force of the spring is overcome by a user moving the slider relative to the enclosure such that the slider moves the magnet into proximity of the magnetic sensor to cause the magnetic sensor to generate a sensor signal for performing a function of the electronic device.

BRIEF DESCRIPTION OF THE DRAWINGS

The above and other aspects and features of the disclosure will become more apparent in view of the following detailed description when taken in conjunction with the accompanying drawings wherein like reference numerals identify similar or identical elements.

DETAILED DESCRIPTION

Figure 1:
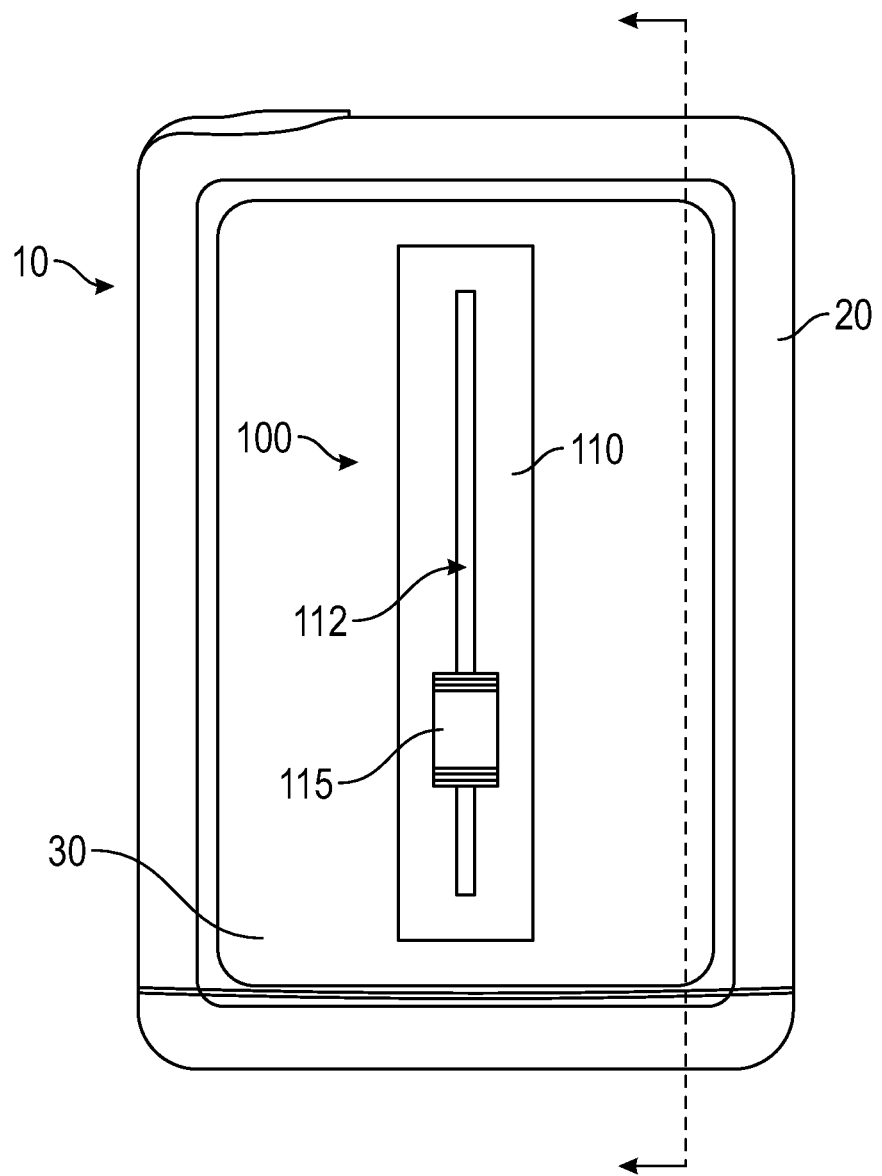
FIG. 1 is a diagram of an exemplary ingress-protected electronic device having an ingress-tolerant switch assembly, in accordance with aspects of the disclosure.

The disclosure relates to ingress-tolerant input devices comprising sliders.

It is desirable for portable electronic devices to have protection against the ingress of harmful elements, particularly water. However, the various moving parts involved in user input devices (e.g., buttons or switches) can pose challenges for ingress protection. For example, a keypad and its electronics may be physically bonded over an opening in the housing of a portable device, and a plastic overlay material may create a watertight seal over the keypad and the device housing. Tight tolerances of mating components help ensure proper compression is maintained, but elastomers typically weaken over time, thereby decreasing compression and creating a risk of water ingress.

To avoid the aforementioned shortcomings, disclosed herein is an ingress-tolerant switch assembly that is operatively connected to the ingress-protected housing of an electronic device. The switch assembly may be ingress-tolerant in that it includes components that remain unaffected by water ingress. For example, components of the switch assembly may be made of corrosion-resistant materials, such as ferromagnetic metal alloys. In contrast, the electronic device may have a watertight housing that is free of any mechanical or electrical interfaces. Thus, the switch assembly is configured to communicate indirectly (e.g., electromagnetically) with the internal electronics of the electronic device. For example, the switch assembly may include a slider configured to move a magnet, and the electronic device may include a magnetic sensor configured to determine the magnet's position based on electromagnetic fields passing through the electronic device housing.

Although the disclosure may be described primarily with respect to electronic medical devices such as insulin delivery systems, the scope of the disclosure is not limited to electronic medical devices. Rather, the disclosure applies to and can be implemented with any suitable electronic device for which water ingress is a concern. It is intended that any aspect, embodiment, and description relating to electronic medical devices shall be applicable to any other types of electronic devices where water ingress is a concern.

Although the disclosure is not limited in this regard, discussions utilizing terms such as, for example, "processing," "computing," "calculating," "determining," "establishing," "analyzing," "checking," or the like, may refer to operation(s) and/or process(es) of a computer, a computing platform, a computing system, or other electronic computing device, that manipulates and/or transforms data represented as physical (e.g., electronic) quantities within the device's registers and/or memories into other data similarly represented as physical quantities within the device's registers and/or memories. As used herein, "memories" may refer to volatile and/or non-volatile memory devices, including non-transitory information storage media that may store instructions for performing operations and/or processes. As used herein, "exemplary" does not necessarily mean "preferred" and may simply refer to an example unless the context clearly indicates otherwise.

Referring to FIG. 1, an exemplary ingress-protected electronic device 10 generally includes an ingress-protected enclosure 20 and a switch assembly 100 at least partially disposed on an outer surface 30 of the enclosure 20. The switch assembly 100 is configured to be manipulated to control functionality of the electronic device 10. The electronic device 10 may be, for example, a medicine delivery device configured to be secured to the body or clothing of a person for delivering a therapeutic substance (e.g., insulin) to the person. In this example, the switch assembly 100 may serve to effect various functionalities of the medicine delivery device such as, for example, medicine administration, adjustment of therapy settings, changing of user preferences, or the like.

Figure 2:
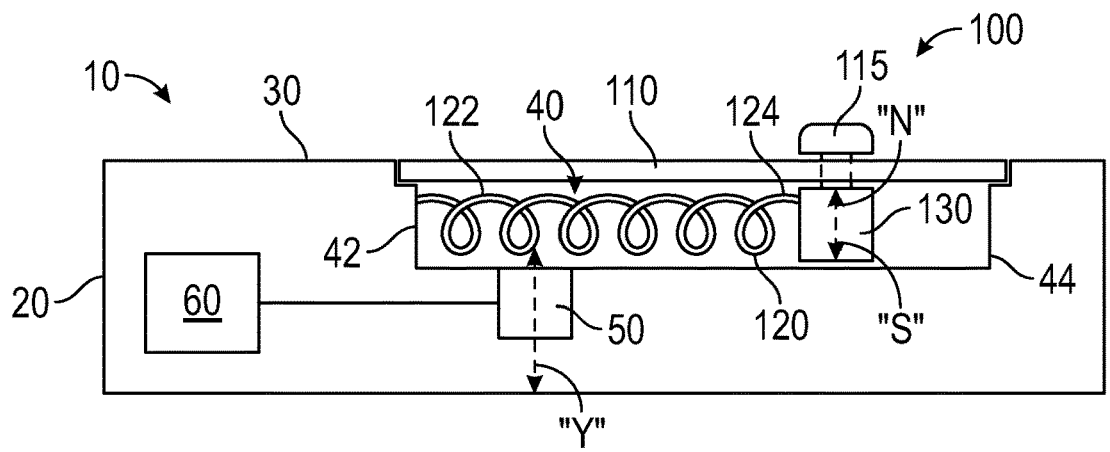
FIG. 2 is a cross-sectional view of the electronic device of FIG. 1 illustrating components of the electronic device and showing the switch assembly in a first configuration, in accordance with aspects of the disclosure.

Referring to FIG. 2, a cross-sectional view of the electronic device 10 is shown and illustrates the switch assembly 100 disposed within a recessed portion 40 defined by the outer surface 30 of the enclosure 20. The switch assembly 100 generally includes a slider 115 (e.g., a sliding button, a sliding knob, or the like) and a switch interface 110 overlaying the recessed portion 40 from a first end 42 of the recessed portion 40 to a second end 44 of the recessed portion 40 to enclose a spring 120 and a magnet 130 within the recessed portion 40. The switch interface 110 may be made from a flexible material (e.g., flexible plastic, rubber, silicone, or the like) and defines a longitudinal slot 112 through which the slider 115 is configured to be moved (e.g., in response to a pushing force imparted by a person's fingertip) to communicate a command to the electronic device 10, as described in more detail below.

In some embodiments, the slider 115 may be a spring-loaded sliding component of a momentary or latching switch. The slider 115 can stay in a first position when not pushed, move to a second position when pushed, and return to the first position when a pushing force is removed. In embodiments, the longitudinal slot 112 defined through the switch interface 110 may also serve as an egress for any fluids such as water that may have entered the recessed portion 40.

As illustrated in FIG. 2, the switch interface 110 may be positioned within the recessed portion 40 of the enclosure 20 such that an outer surface of the switch interface 110 is generally flush with an outer periphery of the enclosure 20 and the slider 115 protrudes at least partially outward from the outer periphery of the enclosure 20. The spring 120 may be any suitable type of spring (e.g., a coil spring, a flat spring, a leaf spring, a compression spring, or the like) and may be made from a material that is resistant to the damaging or corrosive effects of water exposure such as, for example, metal (e.g., stainless steel) or plastic. The spring 120 has a first end 122 coupled to the first end 42 of the recessed portion and a second end 124, opposite the first end 122, that is coupled to the magnet 130.

The magnet 130 may be permanently or releasably coupled to the second end 124 of the spring 120 using any standard mechanical coupling interface (e.g., welding, adhesive, overmolding, latch, etc.). The magnet 130 may also be corrosion resistant and/or include a shell casing that is corrosion resistant. The magnet 130 may be a standard permanent magnet that produces its own magnetic field and has two poles, a north "N" pole and a south "S" pole, as would be understood by persons skilled in the art, and as depicted in FIG. 2.

Figure 3:
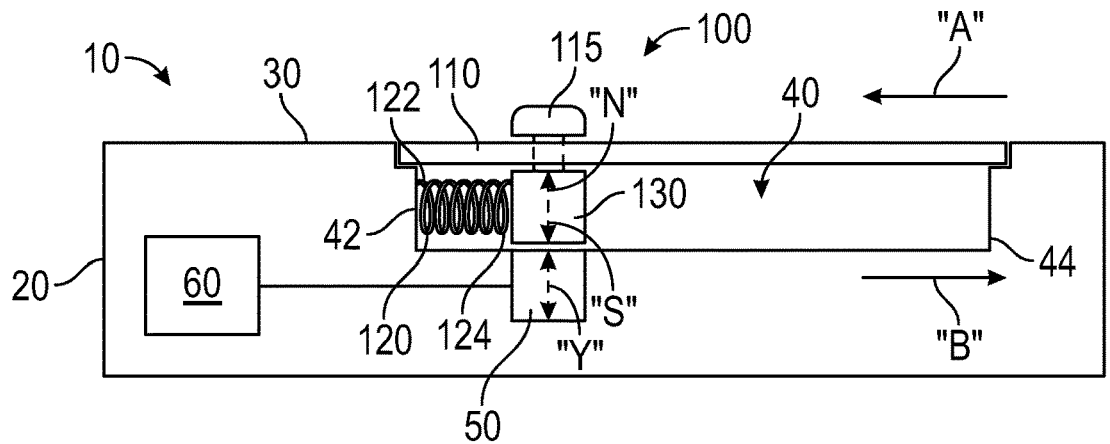
FIG. 3 is a cross-sectional view of the electronic device of FIG. 1 illustrating the switch assembly in a second configuration, in accordance with aspects of the disclosure.
Figure 4:
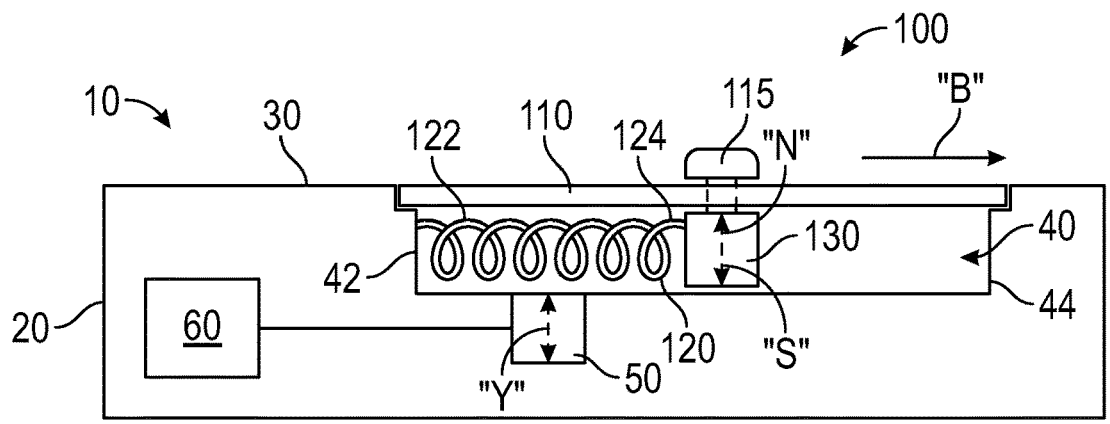
FIG. 4 is a cross-sectional view of the electronic device of FIG. 1 illustrating the switch assembly returning from the second configuration to the first configuration, in accordance with aspects of the disclosure.

A portion of the slider 115 extends through the longitudinal slot 112 and is coupled to the magnet within the recessed portion 40 such that as a user applies a pushing force to the slider 115 to move the slider 115 in the direction indicated by directional arrow "A" in FIG. 3, the spring 120, which is situated between the magnet 130 and the first end 42 of the recessed portion 40, applies a proportional opposing force in the direction indicated by the directional arrow "B" in FIG. 3. Movement of the slider 115 with sufficient force in the "A" direction overcomes the spring force or constant of the spring 120 to transition the spring 120 from a normal unstressed configuration (FIG. 2) to a stressed configuration (FIG. 3). In embodiments, the spring 120 has a first longitudinal length when in the unstressed configuration and has a second longitudinal length when in the stressed configuration that is less than the first length. Movement of the slider 115 in the "A" direction correspondingly moves the magnet 130 in the "A" direction toward the first end 42 of the recessed portion 40 against the bias of the spring 120 such that the magnet 130 moves in a direction (e.g., "A" direction) that is parallel to the direction of the pushing force applied to the slider 115. With reference to FIG. 4, when the slider 115 is no longer pushed (e.g., a pushing force on the slider 115 is removed), the restoring force of the spring 120 returns the spring 120 to its normal unstressed configuration, thereby urging the slider 115 in the "B" direction, which also urges the magnet 130 in the "B" direction, and back to a home position.

Disposed within the enclosure 20 of the electronic device 10 are a magnetic sensor 50 and processing circuitry 60 in communication with the magnetic sensor 50. The processing circuitry 60 is configured to receive and process sensor signals from the magnetic sensor 50. The processing circuitry 60 may include various types of logic circuitry, including, but not limited to, microprocessors, controllers, digital signal processors (DSPs), application specific integrated circuits (ASICs), field-programmable gate arrays (FPGAs), central processing units (CPUs), graphics processing units (GPUs), programmable logic devices, memory (e.g., random access memory, volatile memory, non-volatile memory, etc.), or other discrete or integrated logic circuitry, as well as combinations of such components. The term "processing circuitry" may generally refer to any of the foregoing logic circuitry, alone or in combination with other logic circuitry, or any other circuitry for performing computations.

The magnetic sensor 50 is arranged inside the enclosure 20 in close proximity to the first end portion 42 of the recessed portion 40 and is configured to detect a presence or an absence of the magnetic field produced by the magnet 130. In this way, the magnetic sensor 50 may serve as a proximity sensor that detects whether the magnet 130 is within a predetermined distance from the magnetic sensor 50. When the spring 120 is in its normal unstressed configuration, as shown in FIG. 2, the magnet 130 is sufficiently distanced from the magnetic sensor 50 so that the presence of the magnet 130 is not detectable by the magnetic sensor 50. As the spring transitions from its normal unstressed configuration to its stressed configuration, as shown in FIG. 3, the magnet 130 moves closer to the magnetic sensor 50. When the magnet 130 is moved to within a sufficient proximity to the magnetic sensor 50 (e.g., within a predetermined distance), the magnetic sensor 50 detects the presence of the magnet 130 and/or magnetic field of the magnet 130 (as depicted by magnetic north pole "N" and south pole "S"), and generates a sensor signal that is received and processed by the processing circuitry 60.

In embodiments, the magnetic sensor 50 may be any standard magnetic sensor that is configured to detect the magnitude of magnetism generated by a magnetic material, examples of which include, but are not limited to, a Hall Effect sensor that varies its output voltage in response to changes in magnetic flux, a MEMS magnetic field sensor, a magnetic reed switch, or the like. The sensors described above are exemplary. Other sensors or types of sensors for detecting magnetic properties, among other things, will be recognized by persons skilled in the art and are contemplated to be within the scope of the disclosure. For any sensor, the signal provided by a sensor shall be referred to as a "sensor signal."

In an example implementing the magnetic sensor 50 as a Hall Effect sensor, when the slider 115 is moved in the "A"

direction the magnet 130 is urged to move in the "A" direction toward the first end 42 of the recessed portion 40 into proximity of the magnetic sensor 50, as shown in FIG. 3. As described above, movement of the magnet 130 in the "A" direction is caused by transition of the spring 120 from its normal unstressed configuration (FIG. 2) to its stressed configuration (FIG. 3). As the magnet 130 moves closer to the magnetic sensor 50, the Hall Effect voltage in the magnetic sensor 50 changes due to the approaching proximity of the magnetic field of the magnet 130. This change in Hall Effect voltage is communicated as a sensor signal to the processing circuitry 60, which effects performance or termination of performance of a function related to the operation of the electronic device 10. In some embodiments, the magnetic sensor 50 may be configured such that the magnet 130 and/or the north "N" or south "S" poles of the magnet 130 must be generally aligned with the magnetic sensor 50 or aligned (e.g., an axis of the poles "N" and "S" of the magnet 130 are parallel and substantially co-linear with a sensing axis "Y" of the magnetic sensor 50) with at least a portion of the magnetic sensor 50 before the magnetic sensor 50 communicates a sensor signal to the processing circuitry 60. In this manner, the magnetic sensor 50 may avoid inadvertently generating multiple sensor signals and/or erroneous sensor signals caused by, for example, less than complete actuation of the slider 115, weak detection of the presence of the magnet 130, slow movement of the magnet 130 toward or away from the magnetic sensor 50, etc.

When the magnet 130 moves in the "B" direction away from the magnetic sensor 50 (and the axis of the poles "N" and "S" of the magnet 130 are moved out of alignment or co-linearity with the sensing axis "Y" of the magnetic sensor 50), the Hall Effect voltage changes back to its original state. In some embodiments, this change in Hall Effect voltage may be communicated as a sensor signal to the processing circuitry 60 to effect performance or termination of performance of a function related to the operation of the electronic device 10. As described above, movement of the magnet 130 in the "B" direction is caused by the restoring force of the spring 120 transitioning the spring 120 from its stressed configuration (FIG. 3) back to its normal unstressed configuration (FIG. 2) when a pushing force on the slider 115 is removed (FIG. 4).

Depending on the type of magnetic sensor implemented, the thickness of the walls of the enclosure 20 may be made thinner or thicker to affect the sensitivity of the magnetic sensor 50 with respect to the magnet 130. In some embodiments, the magnetic sensor 50 may be disposed on a printed circuit board (not shown) that is in communication with the processing circuitry 60 and secured to an inner surface of the enclosure 20 in proximity to the recessed portion 40.

In some embodiments, the north "N" and south "S" poles of the magnet 130 move along an axis that is parallel to the surface of the magnetic sensor 50 that faces the recessed portion 40, as shown in FIGS. 2-4. In some embodiments, the magnetic sensor 50 may be disposed in proximity to the first end portion 42 of the recessed portion 40 such that the north "N" and south "S" poles of the magnet 130 move along an axis that is perpendicular to the surface of the magnetic sensor 50 that faces the magnet 130. Stated differently, the magnetic sensor 50 may be disposed along a side wall of the recessed portion 40 instead of along the bottom wall as depicted in FIGS. 2-4, and the north "N" and south "S" poles of the magnet 130 may run parallel to the axis of movement of the spring 120.

The embodiments disclosed herein are examples of the claimed subject matter, which may be embodied in various forms. For instance, although certain embodiments herein are separately described, it should be appreciated that each of the embodiments herein may be combined with one or more of the other embodiments described herein. Specific structural and functional details disclosed herein are not to be interpreted as limiting, but as a basis for the claims and as a representative basis for teaching one skilled in the art to variously employ the disclosure in virtually any appropriately detailed structure. Like reference numerals may refer to similar or identical elements throughout the description of the figures.

The phrases "in an embodiment," "in embodiments," "in various embodiments," "in some embodiments," or "in other embodiments" may each refer to one or more of the same or different embodiments in accordance with the disclosure. A phrase in the form "A or B" means "(A), (B), or (A and B)." A phrase in the form "at least one of A, B, or C" means "(A); (B); (C); (A and B); (A and C); (B and C); or (A, B, and C)."

It should be understood that the foregoing description is only illustrative of the disclosure. To the extent consistent, any or all of the aspects detailed herein may be used in conjunction with any or all of the other aspects detailed herein. Various alternatives and modifications can be devised by those skilled in the art without departing from the disclosure. Accordingly, the disclosure is intended to embrace all such alternatives, modifications, and variances. The embodiments described with reference to the attached drawing figures are presented only to demonstrate certain examples of the disclosure. Other elements, steps, methods, and techniques that are insubstantially different from those described above and/or in the appended claims are also intended to be within the scope of the disclosure.

While several embodiments of the disclosure have been shown in the drawings, it is not intended that the disclosure be limited thereto, as it is intended that the disclosure be as broad in scope as the art will allow and that the specification be read likewise. Therefore, the above description should not be construed as limiting, but merely as exemplifications of particular embodiments. Those skilled in the art will envision other modifications within the scope and spirit of the claims appended hereto.

What is claimed is:

1. An ingress-tolerant switch assembly for operating an electronic device in an ingress-protected manner, the switch assembly comprising:
   a slider configured to move relative to a housing of the electronic device, wherein the housing defines an ingress-protected enclosure;
   a magnet coupled to the slider such that the movement of the slider relative to the housing causes corresponding movement of the magnet relative to the housing; and
   a spring having a first end coupled to the housing and an opposite second end coupled to the magnet, wherein the spring is configured to transition between an unstressed configuration and a stressed configuration in response to the movement of the slider relative to the housing, and wherein the slider, the magnet, and the spring are configured to be supported by the electronic device outside of the ingress-protected enclosure,
   wherein the magnet is configured to move into proximity of a magnetic sensor disposed within the ingress-protected enclosure when the slider moves relative to the housing and the spring transitions between the unstressed configuration and the stressed configuration.

2. The switch assembly of claim 1, wherein the magnetic sensor is a Hall Effect sensor or a magnetic reed switch.

3. The switch assembly of claim 1, wherein the magnet includes a north pole and a south pole, and the magnetic sensor is configured to generate the sensor signal in response to the north pole or the south pole of the magnet being aligned with at least a portion of the magnetic sensor.

4. The switch assembly of claim 1, wherein the electronic device is a medicine delivery device.

5. The switch assembly of claim 1, wherein movement of the slider in a first direction causes the spring to apply a force on the magnet in a second direction opposite the first direction.

6. The switch assembly of claim 1, wherein the spring is formed of a corrosion resistant material.

7. The switch assembly of claim 1, wherein the slider is formed of an elastic material selected from the group consisting of silicone, rubber, and plastic.

8. The switch assembly of claim 1, wherein the spring is configured such that a restoring force of the spring transitions the spring from the stressed configuration to the unstressed configuration to move the magnet out of proximity of the magnetic sensor.

9. The switch assembly of claim 1, further comprising the magnetic sensor, wherein the magnetic sensor is a MEMS magnetic field sensor.

10. The switch assembly of claim 1, wherein the magnet is configured to move within a recessed portion defined by an outer surface of the housing.

11. The switch assembly of claim 10, further comprising a switch interface configured to cover the recessed portion,
wherein the magnet and the spring are configured to be disposed in the recessed portion,
wherein the switch interface defines a longitudinal slot, and
wherein the slider is configured to move within the longitudinal slot when the slider moves relative to the housing.

12. An ingress-protected electronic device, comprising:
an ingress-protected housing defining an ingress-protected enclosure;
a magnetic sensor disposed within the ingress-protected enclosure; and
an ingress-tolerant switch assembly at least partially disposed outside of the ingress-protected enclosure and coupled to the housing, the switch assembly including:
a slider configured to move relative to the housing;
a magnet coupled to slider such that the movement of the slider relative to the housing causes corresponding movement of the magnet relative to the housing and into proximity of the magnetic sensor; and
a spring having a first end coupled to the housing and an opposite second end coupled to the magnet, wherein the spring is configured to transition between an unstressed configuration and a stressed configuration in response to movement of the slider and the magnet relative to the housing, and wherein the slider, the magnet, and the spring are configured to be supported by the electronic device outside of the ingress-protected enclosure,
wherein the spring is configured to transition between the unstressed configuration and the stressed configuration when the magnet moves into proximity of the magnetic sensor, and
wherein the magnetic sensor is configured to communicate a sensor signal to processing circuitry disposed within the ingress-protected enclosure when the magnet moves into proximity of the magnetic sensor to cause performance of a function of the ingress-protected electronic device.

13. The ingress-protected electronic device of claim 12, wherein the magnetic sensor is a Hall Effect sensor or a magnetic reed switch.

14. The ingress-protected electronic device of claim 12, wherein the magnet includes a north pole and a south pole, and wherein the magnetic sensor is configured to generate the sensor signal in response to the north pole or the south pole of the magnet being aligned with at least a portion of the magnetic sensor.

15. The ingress-protected electronic device of claim 12, wherein the ingress-protected electronic device is a medicine delivery device.

16. The ingress-protected electronic device of claim 12, wherein movement of the slider in a first direction causes the spring to apply a force on the magnet in a second direction opposite the first direction.

17. The ingress-protected electronic device of claim 12,
wherein the slider is configured to move relative to the housing from a first position to a second position to move the magnet into proximity of the magnetic sensor, and
wherein the spring is configured such that a restoring force of the spring transitions the spring from the stressed configuration to the unstressed configuration to move the slider toward the first position and the magnet out of proximity of the magnetic sensor.

18. The ingress-protected electronic device of claim 12, wherein the magnet is configured to move within a recessed portion defined by the housing.

19. The ingress-protected electronic device of claim 18, further comprising a switch interface configured to cover the recessed portion,
wherein the magnet and the spring are configured to be disposed in the recessed portion,
wherein the switch interface defines a longitudinal slot, and
wherein the slider is configured to move within the longitudinal slot when the slider moves relative to the housing.

20. An ingress-protected electronic device, comprising:
an ingress-protected housing defining an ingress-protected enclosure;
a Hall Effect sensor disposed within the ingress-protected enclosure; and
an ingress-tolerant switch assembly at least partially disposed outside of the ingress-protected enclosure and coupled to the housing, the switch assembly including:
a slider configured to move relative to the housing between a first position and a second position;
a magnet coupled to the slider such that the movement of the slider to the second position causes corresponding movement of the magnet relative to the housing and into proximity of the Hall Effect sensor; and
a spring having a first end coupled to the housing and an opposite second end coupled to the magnet, wherein the spring configured to transition between an unstressed configuration and a stressed configuration in response to movement of the slider, wherein:
movement of the slider toward the second position overcomes a spring force of the spring to transition the spring from the unstressed configuration to the stressed configuration to move the magnet into proximity of the Hall Effect sensor;

the Hall Effect sensor is configured to communicate a sensor signal to processing circuitry disposed within the ingress-protected enclosure when the magnet moves into proximity of the Hall Effect sensor to cause performance of a function of the ingress-protected electronic device; and the spring is configured such that a restoring force of the spring transitions the spring from the stressed configuration to the unstressed configuration to move the slider toward the first position and move the magnet out of proximity of the Hall Effect sensor.

\* \* \* \* \*